(12) United States Patent
Maier et al.

(10) Patent No.: US 10,108,895 B2
(45) Date of Patent: Oct. 23, 2018

(54) OPERATOR CONTROL SYSTEM FOR A MOTOR VEHICLE

(71) Applicant: Leopold Kostal GmbH & Co. KG, Luedenscheid (DE)

(72) Inventors: Oliver Maier, Attendorn (DE); Stefan Schroeder, Luedenscheid (DE); Christian Schirp, Bochum (DE)

(73) Assignee: Leopold Kostal GmbH & Co. KG, Luedenscheid (DE)

( * ) Notice: Subject to any disclaimer, the term of this patent is extended or adjusted under 35 U.S.C. 154(b) by 0 days.

(21) Appl. No.: 15/712,547

(22) Filed: Sep. 22, 2017

(65) Prior Publication Data

US 2018/0025264 A1    Jan. 25, 2018

Related U.S. Application Data

(63) Continuation of application No. PCT/EP2016/059416, filed on Apr. 27, 2016.

(30) Foreign Application Priority Data

Apr. 28, 2015 (DE) .................. 10 2015 005 341
Jun. 1, 2015 (DE) .................. 10 2015 007 108

(51) Int. Cl.
*G06K 19/07* (2006.01)
*B60K 37/00* (2006.01)
(Continued)

(52) U.S. Cl.
CPC ............ *G06K 19/077* (2013.01); *B60K 37/00* (2013.01); *B60K 37/06* (2013.01); *G05G 1/00* (2013.01);
(Continued)

(58) Field of Classification Search
CPC ........ H01H 9/18; H01H 13/708; G08C 17/02; B60R 16/20
(Continued)

(56) References Cited

U.S. PATENT DOCUMENTS 6,140,593 A    10/2000 Bramesfeld et al.
6,163,282 A    12/2000 Mitsuzuka et al.
(Continued)

FOREIGN PATENT DOCUMENTS

DE    29515351 U1    11/1995
DE    19824197 A1    12/1998
(Continued)

OTHER PUBLICATIONS

The International Bureau of WIPO, International Preliminary Report on Patentability for the corresponding International Application No. PCT/EP2016/059416, dated Oct. 31, 2017.
(Continued)

*Primary Examiner* — Tan Q Nguyen
(74) *Attorney, Agent, or Firm* — Brooks Kushman P.C.

(57) ABSTRACT

An operator control system includes switches, RFID transponders, and a RFID reader. Each switch has a cap support and a switch cap. The switch caps are respectively interchangeably attachable to the cap supports. The RFID transponders are respectively attached to the switch caps. Each RFID transponder stores a respective piece of information identifying a respective control function so that the switch cap to which the RFID transponder is attached is associated with the respective control function. The RFID reader is arranged on at least one of the switches for reading the piece of information of at least one of the RFID transponders.

9 Claims, 2 Drawing Sheets

(51) Int. Cl.
*G06K 19/077* (2006.01)
*G05G 1/00* (2006.01)
*H03K 17/972* (2006.01)
*B60K 37/06* (2006.01)
*H01H 13/705* (2006.01)

(52) U.S. Cl.
CPC ......... *H01H 13/705* (2013.01); *H03K 17/972* (2013.01); *H01H 2221/066* (2013.01); *H01H 2233/074* (2013.01); *H01H 2300/032* (2013.01); *H03K 2217/958* (2013.01)

(58) Field of Classification Search
USPC .............................................................. 701/1
See application file for complete search history.

(56) References Cited

U.S. PATENT DOCUMENTS

| | | | |
|---|---|---|---|
| 6,812,838 | B1 | 11/2004 | Maloney |
| 8,214,004 | B2 | 7/2012 | Taxis |
| 2002/0047777 | A1* | 4/2002 | Casden ................ G06K 7/0008 340/10.32 |
| 2003/0016136 | A1 | 1/2003 | Harvey |
| 2004/0016136 | A1* | 1/2004 | Igarashi ................ B24B 9/144 33/200 |
| 2004/0056781 | A1 | 3/2004 | Rix et al. |
| 2004/0114934 | A1 | 6/2004 | Taxis |
| 2010/0079289 | A1* | 4/2010 | Brandt ................... H01H 9/168 340/572.7 |
| 2012/0139712 | A1* | 6/2012 | Jung .................. G06K 7/10356 340/10.5 |
| 2014/0289438 | A1 | 9/2014 | Benni et al. |
| 2014/0372124 | A1 | 12/2014 | Thizon |
| 2016/0188928 | A1* | 6/2016 | Blackwood ........ G06K 7/10366 340/10.1 |

FOREIGN PATENT DOCUMENTS

| | | |
|---|---|---|
| DE | 19839811 A1 | 3/2000 |
| DE | 19841738 A1 | 3/2000 |
| DE | 19955070 A1 | 5/2000 |
| DE | 10060981 A1 | 7/2002 |
| DE | 10244304 B3 | 3/2004 |
| DE | 10252689 A1 | 6/2004 |
| DE | 102009006693 A1 | 12/2009 |
| DE | 102010010574 A1 | 9/2011 |
| JP | 2005254955 A | 9/2005 |
| WO | 2007048054 A2 | 4/2007 |

OTHER PUBLICATIONS

European Patent Office, International Search Report for the corresponding International Application No. PCT/EP2016/059416, dated Jul. 14, 2016.
German Patent Office, German Search Report for the corresponding German Patent Application No. DE 10 2015 007 108.4 dated Jan. 15, 2016.

* cited by examiner

Fig. 1
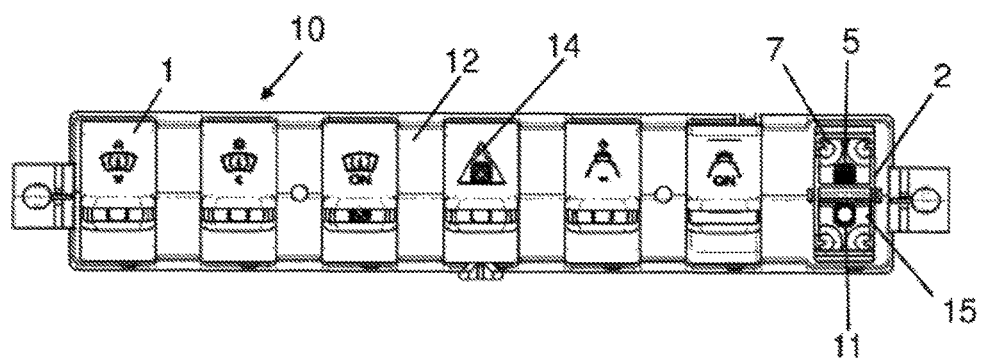
Fig. 2A  Fig. 2B  Fig. 2C
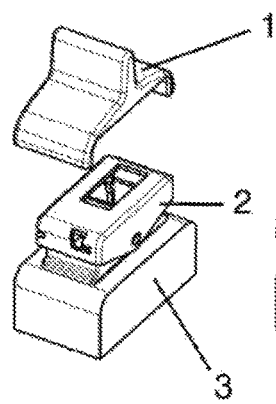 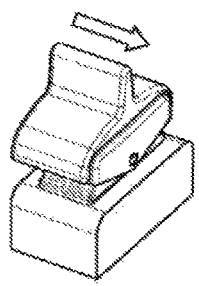 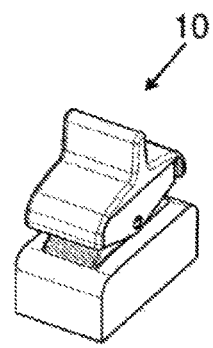
Fig. 3
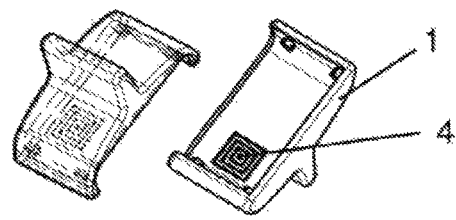

OPERATOR CONTROL SYSTEM FOR A MOTOR VEHICLE

CROSS-REFERENCE TO RELATED APPLICATIONS

This application is a continuation of International Application No. PCT/EP2016/059416, published in German, with an International filing date of Apr. 27, 2016; which claims priority to DE 10 2015 005 341.8, filed Apr. 28, 2015, and DE 10 2015 007 108.4, filed Jun. 1, 2015; the disclosures of which are hereby incorporated in their entirety by reference herein.

TECHNICAL FIELD

The present invention relates to an operator control system for a motor vehicle, the operator control system having multiple switches, each switch having a switch base, a cap support, and a switch cap. The present invention also relates to a method for operating such an operator control system.

BACKGROUND

Due to the virtualization of many control elements in a motor vehicle, i.e., the transfer of switches, control knobs, etc., to displays, a degree of authenticity of the vehicle has been lost. Attempts to counteract this loss include using artificial haptics or overloading the depicted graphical elements with an overabundance of detail. However, the user experience remains "superficial" or "flat".

Advantages of display-based operation control concepts are the ease of exchange, replacement, enhancement, and customization, which with physical control elements are achieved only with a high level of effort.

An operator control system in accordance with embodiments of the present invention at least in part eliminates the disadvantage of the "real" switches, namely, the lack of customizability and adaptability.

To simplify manufacture, and for subsequent customizability in the sense of a process chain, some switch systems have a single type of switch provided with different switch caps. Computer keyboards have this design. However, with computer keyboards, exchanging individual switch caps or even assigning new functions to the switches having exchanged switch caps is generally not provided.

German patent application DE 102 52 689 A1 (corresponding to U.S. Pat. No. 8,214,004) describes an operation control device for a vehicle. The operation control device has control element units and a retaining unit. The control element units are freely configurable with respect to the retaining unit. Each control element unit includes a cover plate, an operating element, and a control circuit. The operating element, such as a rotary/push button or switch, is mounted on the top side of the cover plate. The control circuit includes different electronic components and is connected to the operating element. The control circuit receives control signals from the operating element corresponding to the actuation thereof.

The control element units, in addition to transmitting signals concerning their activation, also transmit signals concerning their identity to a controller. The controller may thus associate received activation signals with the control element units which transmitted the activation signals. The control element units may thus be used at different locations on the retaining unit. Consequently, users may specify, per their needs, the arrangement of the individual operating elements with respect to one another.

The transmission of signals between the control element units and the controller may take place in a wired manner, for example via a bus system, optically, or via a wireless system. In any case, however, the circuit arrangement requires a power supply. As such, when the positions of the control element units are exchanged, electrical connections via plug/socket connections, for example, must be separated or established.

Such interventions into the electrical system, which are necessary for the configuration, may discourage users from making changes to the operation control device or may cause users to limit such changes to a minimum. Changes made to the operation control device without due care may cause malfunctions. For example, malfunctions may be caused when electrical plug-in connections are not carefully established or when electrostatic discharges reach a control electronics system via exposed plug-in connections.

SUMMARY

An object includes a flexibly adaptable operator control system for which changes to the configuration may be easily made and in which the risk of malfunctions due to the adjustments made is very low.

In carrying out at least one of the above and/or other objects, an operator control system for a vehicle is provided. The operator control system includes switches, RFID transponders, and RFID readers. Each switch has a cap support and a switch cap. The switch caps are respectively interchangeably attachable to the cap supports. The RFID transponders are respectively attached to the switch caps. Each RFID transponder stores a respective piece of information identifying a respective control function so that the switch cap to which the RFID transponder is attached is associated with the respective control function. The RFID readers are respectively arranged on the switches for reading the pieces of information of the RFID transponders.

The operator control system may further include a controller electrically connected to the RFID readers to assign to the switches the respective control functions associated with the RFID transponders attached to the switch caps attached to the cap supports of the switches.

The controller is electrically connected to the switches via at least one signal line. The controller is operable to detect switching states of the switches via the at least one signal line and enables execution of the respective control functions assigned to the switches.

Each switch cap may have a symbol or a label indicative of the control function identified by the piece of information stored in the RFID transponder attached to the switch cap.

Further, in carrying out at least one of the above and/or other objects, a method for operating the operator control system is provided. The method includes using a controller to detect the pieces of information of the RFID transponders via the RFID readers each time the vehicle is started. The method further includes assigning, by the controller, to the switches the respective control functions associated with the RFID transponders attached to the switch caps attached to the cap supports of the switches.

An embodiment provides an operator control system (or operation control system) for a motor vehicle. The operator control system includes multiple switches. Each has a switch base, a cap support (or cap carrier), and a switch cap. The switch caps can be fitted interchangeably on the cap supports of different ones of the switches. Each switch cap has a RFID (radio-frequency identification) transponder. The operation control system further includes at least one RFID reader associated with the switches. Each RFID transponder stores a respective readable piece of information that is associated with a control function within the operator control system. Another embodiment provides a method for operating such an operator control system.

In embodiments, switch caps are exchangeably attachable to cap supports of various switches of an operator control system, the switch caps each have an RFID transponder, at least one RFID reader is situated on the switches, and readable information associated with a respective control function within the operator control system is stored in each RFID transponder.

Herein, the term "switch" is to be broadly construed and encompasses on/off switches, toggle switches, and push switches that open or close only during actuation. In these cases, in a switch the cap support is an element which is situated to be moveable with respect to the switch base and which forms part of the switch mechanism. The switch may thus form a push switch or rocker switch, for example. In the case of a rocker switch, the cap support may form all or part of the rocker of the rocker switch.

Furthermore, the switch may be designed as a touch switch having no mechanically moving parts. The switch detects, for example, by a capacitive sensor system, when the switch cap of the switch is touched. In this case, the cap support is used solely as a retaining element for fastening the switch cap. The cap support itself is mounted so that it is mechanically immovable with respect to the switch base of the switch.

The operator control system has multiple, i.e., at least two, switches. The switches may all be the same type or may be of various types. The only prerequisite is that the switches have switch caps that are interchangeably situated on the switches.

In the case of reduced-component assemblies, individual switches may be closed with blind caps so that functions may be retrofitted. For example, functions may be retrofitted by the purchase of additional switch caps after the vehicle is delivered to the customer. The blind caps may be manufactured without an RFID transponder, or may have an RFID transponder whose encoded information explicitly signals to the operator control system that the switch associated with the switch cap is to have no function.

To allow a user to easily change functions and to retrofit new functions, the switch caps are designed such that they are mechanically easy to install and remove from the switches. In embodiments, the switch caps can be easily snapped onto the cap supports of switches so that no special tools or complicated assembly operations are necessary for the installation or replacement.

In embodiments, the switch caps each have labeling or an appropriate symbol that corresponds to their respective encoded functions.

In the subject matter of DE 102 52 689 A1 mentioned above it is the entire control element unit that is exchanged. In contrast, in embodiments, only one design element, namely, the switch cap, provided with an authorization unit that can be wirelessly queried, is exchanged.

In addition, under no circumstances does this exchangeable element transmit control signals generated by the control element. The actual control element and its electrical function are, and remain, an integral part of the basic switch, i.e., the switch base and the cap support. For this reason, in an operator control system in accordance with embodiments of the present invention it is also not necessary to establish an electrical connection between the exchangeable elements, i.e., the switch caps and the basic switches.

BRIEF DESCRIPTION OF THE DRAWINGS

An exemplary embodiment of an operator control system (or operation control system) in accordance with the present invention is illustrated in the drawings and explained in greater detail below. The drawings include the following:

FIG. 1 illustrates a switch panel of an operator control system, the switch panel including multiple switches, each switch having a switch cap, a cap support, and a switch base;

FIGS. 2A, 2B, and 2C illustrate respective sequence views for assembling a switch cap onto a cap support of one of the switches;

FIG. 3 illustrates a switch cap with an embedded RFID transponder; and

DETAILED DESCRIPTION

Figure 4:
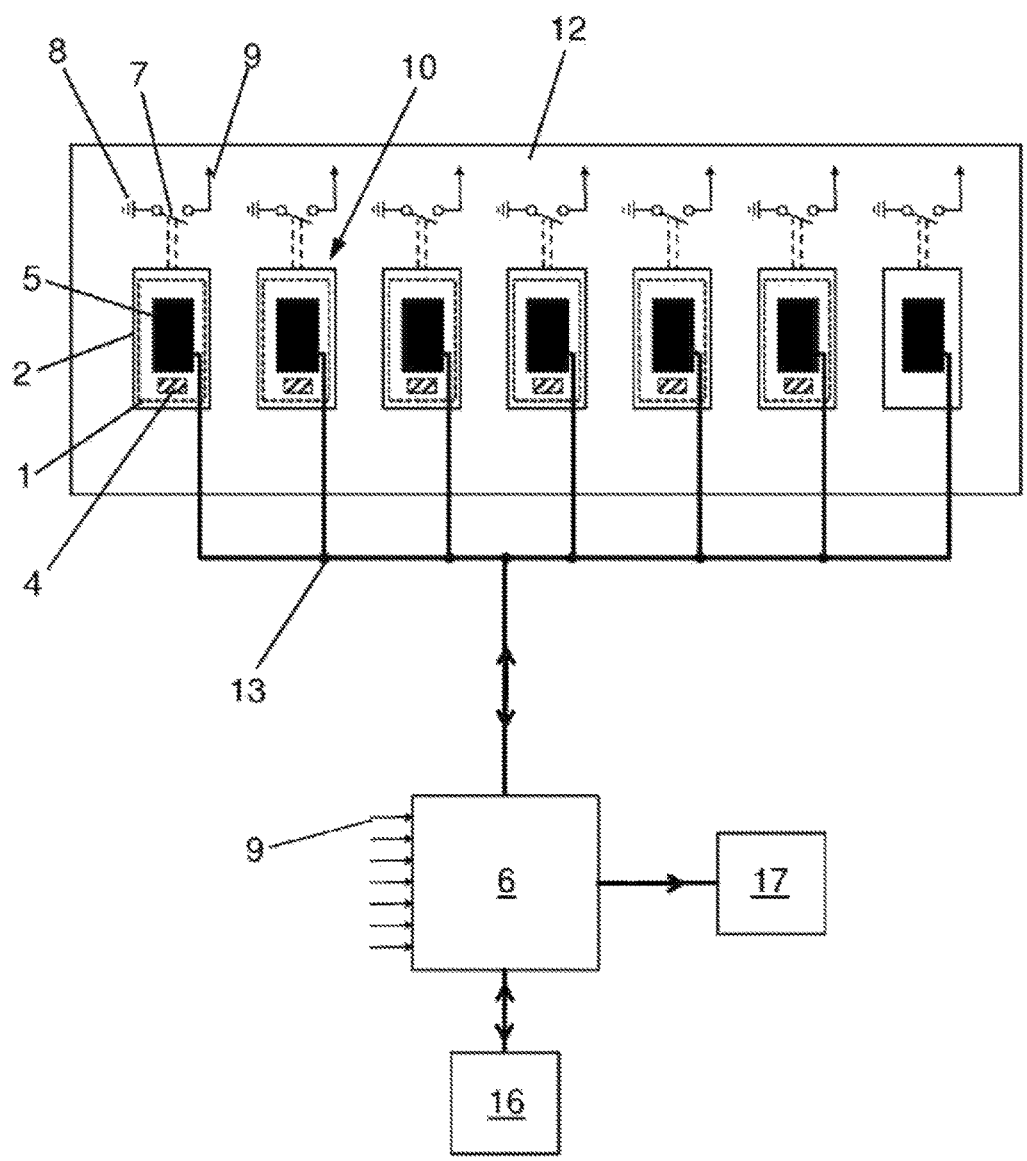
FIG. 4 illustrates a block diagram of the operator control system.

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The drawings schematically depict the design and operating principle of an operator control system in accordance with an embodiment of the present invention.

Referring now to FIG. 1, a switch panel 12 is shown. Switch panel 12 is part of the operator control system. Switch panel 12 includes multiple switches 10. Strictly by way of example, switch panel 12 is illustrated in FIG. 1 as having seven adjacently situated switches 10. For six of these switches 10, in each case a switch cap 1 is apparent. Each switch cap 1 has a symbol 14 applied to its outer side. Each symbol 14 shows the user the control function that may be triggered by the associated switch 10.

The term "switch" herein encompasses switching elements that may be kept switched on or off by actuation and switching elements that change their switching state only during the time that they are manually actuated, i.e., so-called push switches. The switches may have mechanical contact elements or may form contactless sensor touch switches. Regarding the concept of the operator control system in accordance with embodiments of the present invention, the type of switch 10 used is of secondary importance.

Referring now to FIGS. 2A, 2B, and 2C, respective sequence views for assembling a switch cap 1 onto a cap support 2 of one of the switches 10 of switch panel 12 are shown. As shown in FIGS. 2A, 2B, and 2C, switch 10 includes switch cap 1, cap support 2, and a switch base 3. Cap support 2 is fixedly connected to switch base 3. For this switch 10, a switch cap 1 is fastened to cap support 2. For assembly, switch cap 1 may be laterally pushed onto cap support 2 (FIGS. 2A and 2B) and snaps onto cap support 2 as soon as it has reached its intended fastening position (FIG. 2C).

To prevent switch cap 1 from being unintentionally pushed off, provision can be made for a cover frame that laterally surrounds switch 10 and is removable for exchanging switch cap 1 fastened to switch 10. The switch frame itself (not shown) may be fastened by a clip connection so that it may be easily unclipped using a small screwdriver.

Turning back to FIG. 1, at the far-right switch position of switch panel 12, FIG. 1 shows a switch 10 without a switch cap 1. A switch mat 15 together with four switch domes 7 as switching elements of this switch 10 are discernible. Switch mat 15 allows the implementation of push switch functions and the provision of on, off, or changeover functions, for example via a detent switch mechanism or an electronic controller that stores an actuation in memory.

Switch mat 15 is situated on an electrical switch support (not shown). The electrical switch support allows additional electrical components to be easily provided around each switch 10. For example, the additional electrical components may include lighting elements 11 for backlighting switch caps 1 that are part of switches 10. The additional electrical components may also include an RFID reader 5 at each switch 10.

The acronym RFID (radio-frequency identification, i.e., identification using electromagnetic waves) refers to technology for transmitter-receiver systems for automatic, contactless identification of objects using radio waves.

An RFID system includes an RFID transponder 4 (commonly referred to as "RFID tag" or "radio tag") and an RFID reader 5. RFID transponder 4 is situated on or in a respective switch cap 1 and contains a characterizing or identification code. RFID reader 5 is for reading out this identifier.

Read-out takes place by short-range alternating magnetic fields or high-frequency radio waves generated by RFID reader 5. Thus, not only are data transmitted, but RFID transponder 4 is also supplied with power. RFID reader 5 contains software (a micro-program) that controls the actual reading process. RFID reader 5 further contains hardware with interfaces, for example for connecting to a controller 6 (illustrated in FIG. 4) that is part of an automobile electronics system.

To allow a user of the operation control system to easily individually associate, with respect to arrangement and sequence, control functions that are executable by the automobile electronics system, with switches 10, a unique, contactless evaluable identification feature that is implemented by an RFID transponder 4 is situated on or in each switch cap 1.

In this regard, FIG. 3 shows a switch cap 1 having an RFID transponder 4. RFID transponder 4 is illustrated in simplified form as a coupling coil in the shape of a square spiral. RFID transponder 4 is situated on the bottom side of switch cap 1 or molded into the material of switch cap 1.

RFID readers 5 on or in the individual switches 10 of switch panel 12 detect whether switch caps 1 situated on switches 10 have an RFID transponder 4. If a switch cap 1 of a switch 10 has an RFID transponder 4, then a RFID reader 5 periodically reads out the identification features encoded in this RFID transponder. The RFID reader 5 supplies this information to an electronic controller 6, schematically illustrated in FIG. 4, that is part of the operation control system.

Referring now to FIG. 4, a block diagram of the operation control system is shown. The basic design and operating principle of the operation control system are explained in greater detail with the block diagram of FIG. 4. Switch panel 12 with multiple switches 10 is depicted in a more schematic fashion in FIG. 4.

Each switch 10 is associated with a respective RFID reader 5. RFID readers 5 are connected to an electronic controller 6. RFID readers 5 are connected to controller 6 via a bus system 13 or alternatively, via a plurality of single conductors.

Controller 6 regularly controls the individual RFID readers 5 in succession to determine whether an RFID transponder 4 is in the immediate vicinity and to read out information possibly encoded in the RFID transponder 4. This information represents identification features for the individual switches 10 and the control functions to be triggered by the individual switches.

This information is preferably read out by controller 6 each time the vehicle is started. New functions or functions that in the meantime have been placed at other switch positions by a user by exchanging switch caps 1, are thus automatically recognized by controller 6. After RFID transponders 4 are read out, controller 6 may thus associate a control function, to be triggered upon actuation, with switches 10 at each switch position.

The detection of whether a certain switch 10 is actuated is performed independently of the RFID system. The detection is performed by monitoring conventional switching elements 7 of switches 10. As shown in FIG, 4, each switch 10 includes a conventional switching element 7 and each conventional switching element 7 is associated with a ground potential 8 and a signal line 9. Signal lines 9 of switches 10 lead to controller 6. Alternatively, signal lines 9 illustrated here as single lines may also be designed as a bus system.

Upon actuation of a switch 10, conventional switching element 7 of the switch connects signal line 9 of the switch to ground potential 8. Controller 6 recognizes that a switch 10 has been actuated when ground potential 8 is present on signal line 9 of the switch. Based on the previously read-out information of RFID transponder 4 of this switch 10, controller 6 associates a control function to be triggered with the switch actuation and brings about appropriate control or actuation of a functional element 17 of the vehicle.

It is not necessary to associate an individual RFID reader 5 with each individual switch 10 since RFID readers are often able to detect the information of multiple RFID transponders 4 in parallel. In this case, the entire operation control system, unlike the illustration in the drawings, may manage with fewer or a single RFID reader 5. The single RFID reader 5 detects the positions of RFID transponders 4 of switches 10, for example, by a suitable antenna system with spatial resolution to associate specific switch positions with the received identifying information of switches 10. Alternatively, a switch cap 1 may be associated with a certain switch position via other measures such as guided user intervention, for example, a display prompt to press a certain key.

The periodic reading of the identification features by the at least one RFID reader 5 allows the association of switching functions at switch positions to be easily changed at any time by simply exchanging switch caps 1.

In addition, totally new functions can be introduced into a vehicle by adding switch caps 1 having new identification features. For this purpose, the vehicle may obtain software, required for executing the function that is activatable by a new switch 10, from the manufacturer via a remote data link 16, such as a GSM or LTE link.

In an embodiment, the vehicle from the factory already has functional feature variants embedded in the operating software of controller 6, which may be enabled for use in the presence of appropriate identification features in the RFID transponders of switch caps 1.

Alternatively, the packaging of switch cap 1 may contain a unique two-dimensional barcode that may be transmitted, for example, via a smart phone and its Internet connection to the manufacturer's computing center. The activation of the function in question in the vehicle may be triggered via this Internet connection to the manufacturer's computing center, or appropriate software may be transmitted to the vehicle. In this design, switch cap 1 does not need to carry individual information, and only requires the multiply assigned identification feature of the function to be enabled.

LIST OF REFERENCE NUMERALS 1 switch cap
2 cap support
3 switch base
4 RFID transponder
5 RFID reader
6 controller
7 switch domes (switching elements)
8 ground potential
9 signal line
10 switch
11 lighting elements
12 switch panel
13 bus system
14 legend or symbol
15 switch mat
16 remote data link
17 functional element While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. An operator control system for a vehicle, comprising:
a plurality of switches, each switch having a cap support and a switch cap, wherein the switch caps are respectively interchangeably attachable to the cap supports;
a plurality of RFID transponders respectively attached to the switch caps, wherein each RFID transponder stores a respective piece of information identifying a respective control function so that the switch cap to which the RFID transponder is attached is associated with the respective control function;
at least one RFID reader for reading the pieces of information of the RFID transponders;
a controller electrically connected to the at least one RFID reader and to the switches;
wherein the controller independently of actuation of the switches is operable to, prior to the switches being actuated, read the at least one RFID reader and assign to the switches the respective control functions associated with the RFID transponders attached to the switch caps attached to the cap supports of the switches; and
wherein the controller independently of the RFID transponders and of the at least one RFID reader is operable to detect actuation of the switches and enable execution of the respective control functions assigned to the switches detected by the controller as having been actuated.

2. The operator control system of claim 1 wherein:
the at least one RFID reader includes a plurality of RFID readers, each RFID reader arranged on a respective one of the switches for reading the piece of information of the RFID transponder attached to the switch cap of the one of the switches.

3. The operator control system of claim 1 wherein:
the at least one RFID reader includes a RFID reader operable to detect locations of the RFID transponders with spatial resolution.

4. The operator control system of claim 1 wherein:
at least one of the switches is a push switch.

5. The operator control system of claim 1 wherein:
at least one of the switches is a touch switch.

6. The operator control system of claim 1 wherein:
each switch cap has a symbol or a label indicative of the control function identified by the piece of information stored in the RFID transponder attached to the switch cap.

7. An operator control system for a vehicle, comprising:
a plurality of switches, each switch having a cap support and a switch cap, wherein the switch caps are respectively interchangeably attachable to the cap supports;
a plurality of RFID transponders respectively attached to the switch caps, wherein each RFID transponder stores a respective piece of information identifying a respective control function so that the switch cap to which the RFID transponder is attached is associated with the respective control function; and
a plurality of RFID readers respectively arranged on the switches separate from the switch caps for respectively reading the pieces of information of the RFID transponders;
a controller electrically connected to the RFID readers and to the switches;
wherein the controller independently of actuation of the switches is operable to, prior to the switches being actuated, read the RFID readers and assign to the switches the respective control functions associated with the RFID transponders attached to the switch caps attached to the cap supports of the switches; and
wherein the controller independently of the RFID transponders and of the RFID readers is operable to detect actuation of the switches and enable execution of the respective control functions assigned to the switches detected by the controller as having been actuated.

8. The operator control system of claim 7 wherein:
each switch cap has a symbol or a label indicative of the control function identified by the piece of information stored in the RFID transponder attached to the switch cap.

9. A method for an operator control system of a vehicle, the operator control system including a plurality of switches each switch having a cap support and a switch cap, wherein the switch caps are respectively interchangeably attachable to the cap supports, a plurality of RFID transponders respectively attached to the switch caps in which each RFID transponder stores a respective piece of information identifying a respective control function so that the switch cap to which the RFID transponder is attached is associated with the respective control function, a plurality of RFID readers respectively arranged on the switches separate from the switch caps for respectively reading the pieces of information of the RFID transponders, and a controller electrically connected to the RFID readers and to the switches, the method comprising:

detecting, by the controller, independently of actuation of the switches, the pieces of information of the RFID transponders via the RFID readers each time the vehicle is started;

assigning to the switches, by the controller, prior to the switches being actuated, the respective control functions associated with the RFID transponders attached to the switch caps attached to the cap supports of the switches;

detecting actuation of the switches, by the controller, independently of the RFID transponders and of the RFID readers; and enabling, by the controller, execution of the respective control functions assigned to the switches detected by the controller as having been actuated.

* * * * *